US005693377A

United States Patent [19]

Westmoreland et al.

[11] Patent Number: 5,693,377
[45] Date of Patent: Dec. 2, 1997

[54] METHOD OF REDUCING CARBON INCORPORATION INTO FILMS PRODUCED BY CHEMICAL VAPOR DEPOSITION INVOLVING TITANIUM ORGANOMETALLIC AND METAL-ORGANIC PRECURSOR COMPOUNDS

[75] Inventors: Donald L. Westmoreland, Boise; Brenda D. Wanner, Meridian; David R. Atwell, Boise, all of Id.

[73] Assignee: Micron Technology, Inc., Boise, Id.

[21] Appl. No.: 585,353

[22] Filed: Jan. 8, 1996

[51] Int. Cl.$^6$ .................................................. C23C 16/34
[52] U.S. Cl. ..................... 427/582; 427/584; 427/250; 427/255; 427/255.2
[58] Field of Search ........................... 427/582, 584, 427/250, 255, 255.2

[56] References Cited

U.S. PATENT DOCUMENTS

| | | | |
|---|---|---|---|
| 4,558,509 | 12/1985 | Tiwari | 29/576 B |
| 4,568,565 | 2/1986 | Gupta et al. | 427/53.1 |
| 5,080,927 | 1/1992 | Ikeda et al. | 427/53.1 |
| 5,130,172 | 7/1992 | Hicks et al. | 427/252 |
| 5,139,825 | 8/1992 | Gordon et al. | 427/255.2 |
| 5,192,589 | 3/1993 | Sandhu | 427/255.1 |
| 5,273,783 | 12/1993 | Wanner | 427/250 |
| 5,300,321 | 4/1994 | Nakano et al. | 427/248.1 |
| 5,320,878 | 6/1994 | Maya | 427/573 |
| 5,399,379 | 3/1995 | Sandhu | 427/255.2 |
| 5,403,620 | 4/1995 | Kaesz et al. | 427/252 |

FOREIGN PATENT DOCUMENTS

| | | |
|---|---|---|
| 468395 | 1/1992 | European Pat. Off. . |
| 2239184 | 9/1990 | Japan . |

OTHER PUBLICATIONS

"Thin Solid Films", Photochemical Vapor Deposition, Elsevier Sequoia S.A., (1980), pp. L25–L28 (no month) George et al.

Niemer, Burkhard et al., "Organometallic Chemical Vapor Deposition Of Tungsten Metal, And Suppression Of Carbon Incorporation By Codeposition Of Platinum", University of California, Department of Chemical Engineering, 4 Aug. 1992.

Conrad, J.R. et al., "Ion Beam Assisted Coating And Surface Modification With Plasma Source Ion Implantation", J. Vac. Sci. Technol. A8 (4), Jul./Aug. 1990, pp. 3146–3151.

H. Watanabe et al., "Stacked Capacitor Cells for High–Density Dynamic RAM's", IED 1988, pp. 600–603 (no month).

T. Morihara et al., "Disk–Shaped Stacked Capacitor Cell For 256 Mb Dynamic Random–Access Memory", Aug. 19, 1994, Jpn. J. Appl. Phys. vol. 33 (1994), Pt. 1, No. 8, pp. 14–19.

(List continued on next page.)

Primary Examiner—Shrive Beck
Assistant Examiner—Timothy Meeks
Attorney, Agent, or Firm—Wells, St. John, Roberts, Gregory & Matkin, P.S.

[57] ABSTRACT

A chemical vapor deposition method of providing a layer of material atop a semiconductor substrate using an organometallic or metal-organic precursor in a manner which minimizes carbon incorporation in the layer includes, a) positioning a substrate within a chemical vapor deposition reactor; b) providing a gaseous precursor within the reactor having the substrate positioned therein, the precursor comprising one or a combination of tetrakisdimethylamidotitanium, cyclopentadienylcycloheptatrienyltitanium (CpTiCht), bis(2,4-dimethyl-1,3-pentadienyl)titanium (BDPT), and biscyclopentadienyltitanium diazide ($Cp_2Ti(N_3)_2$); c) exposing the gaseous precursor to high intensity light within the reactor effective to dissociate titanium from the precursor; and d) exposing the substrate to the light exposed gaseous precursor to cause a layer comprising titanium of the precursor to be deposited thereon, the deposited layer having reduced carbon incorporation over what would otherwise be provided under the same deposition conditions but without high intensity light exposure.

11 Claims, 1 Drawing Sheet

OTHER PUBLICATIONS

S. Woo et al., "Selective Etching Technology of in-situ P Doped Poly-Si (SEDOP) for High Density DRAM Capacitors", 1994 Symposium on VLSI Technology of Technical Papers, pp. 25-26 (no month).

Motojima, et al., "Preparation Of TiN Films By Photochemical Vapor Deposition", Appl. Phys. Lett., vol. 54, No. 12, Mar. 20, 1989, pp. 1104-1105.

Motojima et al., "Preparation Of $TiB_2$ Films By Photochemical Vapor Deposition Using A $D_2$ Lamp", Appl. Phys. Lett., vol. 56, No. 10, Mar. 5, 1990, pp. 916-918.

Tsao et al, "Photodeposition Of Ti And Application To Direct Writing Of $Ti:LiNbO_3$ Waveguides", Appl. Phys. Lett., vol. 42, No. 7, Apr. 1, 1983, pp. 559-561.

"Thin Solid Films", Photochemical Vapor Deposition—Source #24, 1980, pp. L25-L28 (no month).

Chemical Analysis, vol. 122, "Overview of Photochemical Vapor Deposition", 1992, pp. 8-15, 58-81, 86-91, 142-149, 160-167, 182, 183, 188, 189 (no month).

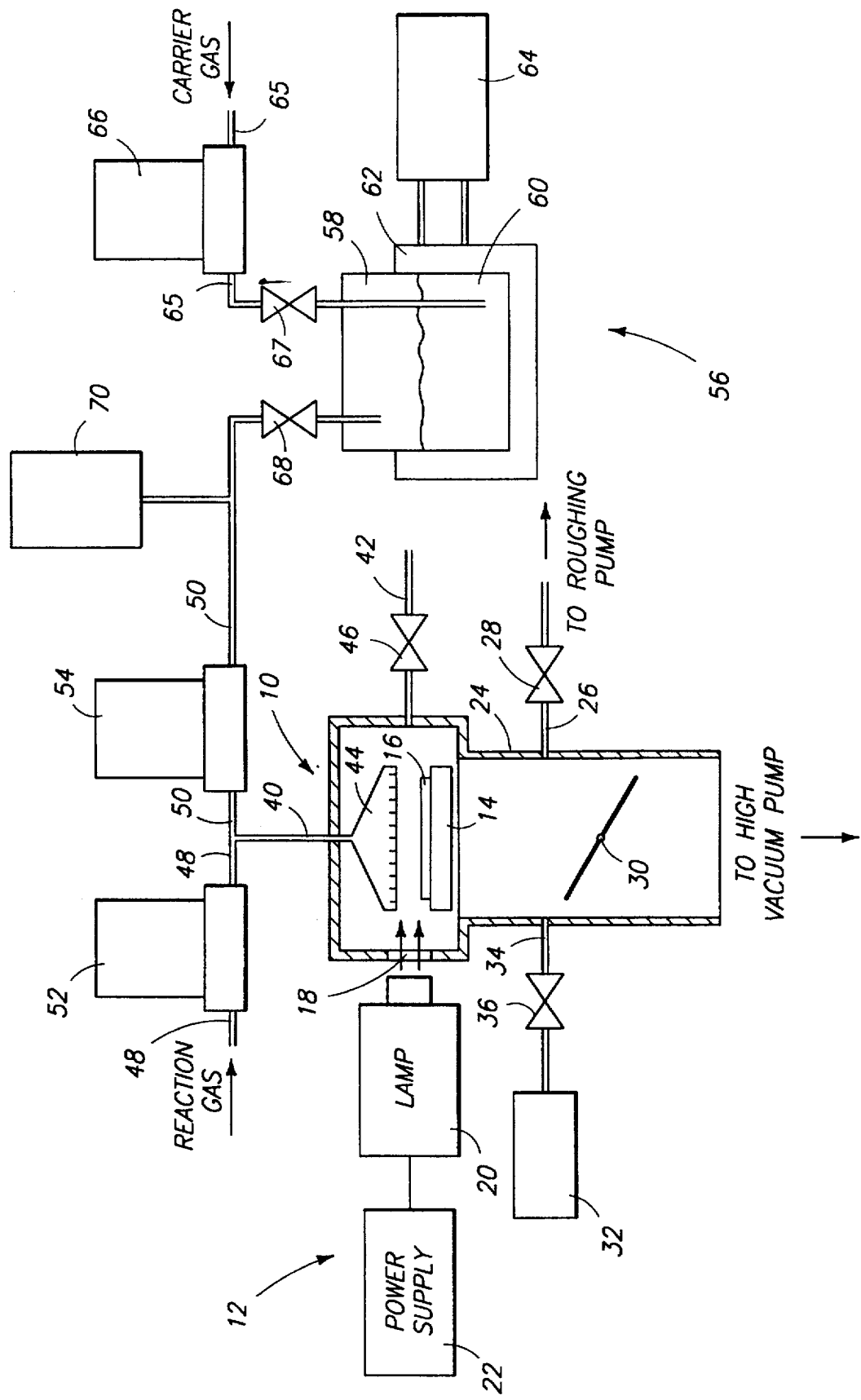

5,693,377

METHOD OF REDUCING CARBON INCORPORATION INTO FILMS PRODUCED BY CHEMICAL VAPOR DEPOSITION INVOLVING TITANIUM ORGANOMETALLIC AND METAL-ORGANIC PRECURSOR COMPOUNDS

TECHNICAL FIELD

This invention relates to methods of reducing carbon incorporation into films produced by chemical vapor deposition involving titanium organometallic and metal-organic precursor compounds.

BACKGROUND OF THE INVENTION

Chemical vapor deposition (CVD) is defined as the formation of a non-volatile solid film on a substrate by the reaction of vapor phase reactants that contain desired components. The gases are introduced into a reactor vessel, and decompose and react at a heated surface on the wafer to form the desired film. Chemical vapor deposition is but one process of providing thin films on semiconductor wafers, such as films of elemental metals or compounds. It is a favored deposition process in many respects, principally because of its ability to provide highly conformal layers even within deep contacts and other openings.

Organic compounds are commonly utilized as chemical vapor deposition precursors. One subclass of this group which is finding increasing use in chemical vapor deposition of metals and metal compounds is organometallic/metal-organic precursors. Specifically, an example is the reaction of a titanium metal-organic precursor of the formula $Ti(N(CH_3)_2)_4$, named tetrakisdimethyl-amidotitanium (TDMAT), and ammonia in the presence of a carrier gas which reacts to produce TiN according to the following formula:

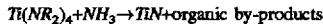

$Ti(NR_2)_4 + NH_3 \rightarrow TiN + \text{organic by-products}$

Organometallic and metal-organic compounds contain a central or linking atom or ion (Ti in TDMAT) combined by coordinate bonds with a definite number of surrounding ligands, groups or molecules, at least one of which is organic (the $(N(CH_3)_2$ groups in TDMAT). The central or linking atom as accepted within the art may not be a "metal" in the literal sense. As accepted within the art of organometallic compounds, the linking atom could be anything other than halogens, the noble gases, H, C, N, O, P, S, Se, and Te. The terms "organometallic" and "metal-organic" are often used by those in the art interchangeably, although there is a technical distinction between the two. Technically in an "organometallic", the "metal" is bonded to at least one carbon atom of the ligand. In a "metal-organic", the "metal" is bonded directly to atoms other than carbon in the ligand.

The above and other chemical vapor deposition reactions involving organometallics/metal-organics are typically conducted at low pressures of less than 1 Torr. It is typically desirable in low pressure chemical vapor deposition processes to operate at as low a pressure as possible to assure complete evacuation of potentially undesirable reactive and contaminating components from the chamber. Even small amounts of these materials can result in a significant undesired increase in film resistivity. For example, oxygen incorporation into the film before and after deposition results in higher resistivity. Additionally, it is believed that organic incorporation (specifically pure carbon or hydrocarbon incorporation) into the resultant film reduces density and increases resistivity. Such organic incorporation can result from carbon radicals from the organic portion of the precursor becoming incorporated into the film, as opposed to being expelled with the carrier gas. Carbon incorporation can also cause other undesired attributes in the deposited film, such as low density which causes oxygen incorporation into the film when exposed to ambient air.

Hydrogen is a known capable reactant with deposited carbon or metal carbides. Such will react with carbon atoms to form volatile hydrocarbons. Hydrogen atoms, radicals or ions are more reactive than molecular hydrogen in producing volatile hydrocarbons.

It would be desirable to improve upon these and other prior art chemical vapor deposition processes in producing layers having minimal incorporated carbon.

BRIEF DESCRIPTION OF THE DRAWINGS

Preferred embodiments of the invention are described below with reference to the following accompanying drawings.

FIGURE 1 is a schematic of equipment usable in a process in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a chemical vapor deposition method of providing a layer of material atop a semiconductor substrate using an organometallic or metal-organic precursor in a manner which minimizes carbon incorporation in the layer comprises, positioning a substrate within a chemical vapor deposition reactor;

providing a gaseous precursor within the reactor having the substrate positioned therein, the precursor comprising one or a combination of tetrakisdimethylamidotitanium, cyclopentadienylcycloheptatrienyltitanium (CpTiCht), bis (2,4-dimethyl-1,3-pentadienyl)titanium (BDPT), and biscyclopentadienyltitanium diazide $(Cp_2Ti(N_3)_2)$;

exposing the gaseous precursor to high intensity light within the reactor effective to dissociate titanium from the precursor; and exposing the substrate to the light exposed gaseous precursor to cause a layer comprising titanium of the precursor to be deposited thereon, the deposited layer having reduced carbon incorporation over what would otherwise be provided under the same deposition conditions but without high intensity light exposure.

FIG. 1 illustrates an example system for carrying out a process in accordance with the invention. Such comprises in principal part a chemical vapor deposition reactor 10 and a high intensity light source 12 for such reactor. The remaining components predominantly comprise gas delivery systems for reactor 10 and suitable piping for providing a desired vacuum pressure within reactor 10.

Specifically, reactor 10 comprises a heatable substrate carrier 14 capable of holding and heating a substrate 16. Substrate carrier 14 preferably maintains substrate 16 at a temperature during processing of from 200° C. to 650° C. A quartz window 18 is provided in a sidewall of reactor 10 for providing desired high intensity light therewithin. Preferred high intensity light in accordance with the invention is provided to reactor 10 at some wavelength from about 100 nm to about 800 nm. An example high intensity light source 12 includes an ultraviolet lamp component 20 and an ultraviolet power supply source 22. Example equipment includes an Oriel 1000W Mercury Arc Lamp purchasable from Oriel Corporation of Stratford, Conn. The power supply preferably provides selectively variable adjustable power of from 0 to 1,000 watts.

A reactor outlet 24 is provided for pressure draw-down within reactor 10 and exhausting reactive gases from the reactor at the completion of processing. A line 26 is connected with a vacuum roughing pump (not shown) through an intermediate valve 28 and connects with reactor outlet 24. Such is utilized to provide an initial pressure and draw-down of the reactor from ambient, and lastly to exhaust a majority of the reactive gases from the reactor. Reactor outlet 24 extends downwardly for making a down-stream connection with a high vacuum pump (not shown) through a pressure control valve 30. A pressure gauge 32 connects with reactor outlet 24 opposite roughing pump line 26 via a line 34 and isolation valve 36. Example and preferred reactor pressure maintained during deposition is from about 100 mtorr to about 20 Torr.

Reactive and other gases are provided to reactor 10 via a line 40 and a line 42. Line 40 feeds a showerhead 44 positioned over substrate carrier 14 to provide a widespread dispersal of reactant gases relative to the surface of substrate/wafer 16. Gas inlet line 42 is utilized to provide reactant or other gases, such as purge gases, controllably to reactor 10 via a control valve 46.

Line 40 receives reactant gases from at least one or both of separate lines 48 and 50. Lines 48 and 50 include respective mass flow controllers 52 and 54 for regulating desired gas flow to showerhead 44. Line 50 connects with an organometallic/metal-organic precursor delivery system 56. System 56 is an example of one of any conceivable means capable of being utilized for providing a gaseous organometallic or metal-organic precursor to reactor 10 having substrate 16 positioned therein. Organometallic and metal-organic precursors are typically liquids at room temperature, and system 56 provides but one means of converting and delivering such material into a gaseous form into reactor 10. Such is comprised of a bubbler tank 58 which retains a suitable quantity of liquid organometallic or metal-organic precursor material 60. Bubbler tank 58 is surrounded by a heating jacket 62, which in turn communicates with a fluid heating and recirculating pump system 64. An example heating fluid is silicone oil. A suitable carrier gas is provided or bubbled into bubbler chamber 58 through line 65, mass flow controller 66, and valve 67. Example suitable carrier gases are gases which are inert to reaction with the organometallic or metal-organic precursor such as helium, nitrogen or argon. Alternately, potentially reactive gases of hydrogen or ammonia might also be utilized as carrier gases. The gasified organometallic or metal-organic precursor exits bubbler chamber 58 into line 50 via a control valve 68. A pressure gauge 70 is provided for monitoring pressure within line 50. An example flow rate for the carrier gas will provide a partial pressure of such gas within the reactor during processing of from 5 to 200 mTorr.

An example process in accordance with the invention would first position substrate 16 within chemical vapor deposition reactor 10. The system would then be provided at a suitable selected pressure. One or more of specific gaseous organometallic or metal-organic precursors would be provided within reactor 10 via lines 50, 40 and 44, with substrate 16 being positioned therein. The specific operable precursors of the invention are one or a combination of tetrakisdimethylamidotitanium, cyclopentadienylcycloheptatrienyltitanium (CpTiCht), bis(2,4-dimethyl-1,3-pentadienyl)titanium (BDPT), and biscyclopentadienyltitanium diazide ($Cp_2Ti(N_3)_2$).

The gaseous particular organometallic or metal-organic precursors fed to reactor 10 are exposed to high intensity light via light system 12 within reactor 10 effective to dissociate the titanium and organic components of the precursor from one another. Generally, a sufficient intensity of light to induce a dissociation is at least about 100 mW/cm$^2$. The light utilized can comprise a broad band spectrum, or a very narrow band spectrum using suitable filters. Such can be provided also by lasers with a continuous beam or a pulse beam, such as is produced by an excimer laser.

Substrate 16 is consequently exposed to the light exposed gaseous precursor to cause a layer comprising titanium of the precursor to be deposited thereon, with the deposited layer having reduced carbon incorporation over what would otherwise be provided under the same deposition conditions but without use of any high intensity light exposure. The process may further include providing other reactive gases via lines 48 and/or 42 to reactor 10, with such reactive gases combining with titanium of the light exposed precursor to deposit a titanium compound layer on the substrate. Alternately, an elemental titanium layer might be deposited. Example reactive gases include ammonia, hydrazine, and 1,1 unsymmetrical dimethylhydrazine. Such compounds provide a suitable nitrogen source to the reactor effective to result in deposition of a TiN layer.

Below is one example set of reaction conditions which were utilized in a reduction to practice example.
Precursor: Cyclopentadienylcycloheptatrienyltitanium (a.k.a. CpTiCht)
Substrate: $SiO_2$
Carrier for CpTiCht: Helium, 20 sccm
Reaction Gas: $NH_3$, 60 sccm
Substrate temp.: 450° C.
Precursor temp.: 135° C.
System pressure: 1084 mTorr
Filament voltage: 40 volts DC
UV watts: 800
UV volts: 36
UV amps: 22.5
Deposition time: 20 min.

The above process produced a film 250 Angstroms thick having bulk resistance of 185 micro ohm/cm. Analysis of the film showed 40% Ti, 20–25% N as TiN, and 25–30% C by atomic weight. Utilization of the identical reaction conditions without use of high intensity light will produce carbon incorporation of at least 70%. Carbon incorporation can further be reduced in accordance with this specific or other examples by increasing the flow rate of the $NH_3$ or a $H_2$ reaction gas to at least 200 sccm. Typical flow rates for hydrazine and 1,1 unsymmetrical dimethylhydrazine are expected to be much lower, on the order of 20 sccm, in producing deposited films having incorporated carbon of less than 1%.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A chemical vapor deposition method of providing a titanium-comprising layer atop a semiconductor substrate using a tetrakisdimethylamidotitanium precursor comprising the following steps:
   positioning a semiconductor substrate within a chemical vapor deposition reactor;
   providing a gaseous tetrakisdimethylamidotitanium precursor within the reactor having the semiconductor substrate positioned therein;
   exposing the gaseous tetrakisdimethylamidotitanium precursor to light having an intensity of at least 100 mW/cm$^2$ within the reactor to dissociate titanium from the tetrakisdimethylamidotitanium precursor; and
   exposing the semiconductor substrate to the light exposed gaseous tetrakisdimethylamidotitanium precursor to cause a layer comprising titanium of the tetrakisdimethylamidotitanium precursor to be deposited thereon.

2. The chemical vapor deposition method of claim 1 wherein the light comprises a wavelength of from about 100 nm to about 800 nm.

3. The chemical vapor deposition method of claim 1 wherein pressure in the reactor during deposition of the layer comprising titanium is from about 100 mTorr to about 20 Torr.

4. The chemical vapor deposition method of claim 1 further comprising providing a reactive gas into the reactor with the substrate positioned therein, the reactive gas combining with the titanium of the light exposed tetrakisdimethylamidotitanium presursor to deposit a titanium compound layer on the substrate.

5. The chemical vapor deposition method of claim 1 further comprising providing hydrazine into the reactor with the substrate positioned therein, the hydrazine combining with the titanium of the light exposed tetrakisdimethylamidotitanium precursor to deposit a titanium nitride layer on the substrate.

6. The chemical vapor deposition method of claim 1 further comprising providing 1,1 unsymmetrical; dimethylhydrazine into the reactor with the substrate positioned therein, the 1,1 unsymmetrical dimethylhydrazine combining with the titanium of the light exposed tetrakisdimethylamidotitanium precursor to deposit a titanium nitride layer on the substrate.

7. A chemical vapor deposition method of providing a titanium-comprising layer atop a semiconductor substrate using a biscyclopentadienyltitanium diazide precursor comprising the following steps:
   positioning a semiconductor substrate within a chemical vapor deposition reactor;
   providing a gaseous biscyclopentadienyltitanium diazide precursor within the reactor having the semiconductor substrate positioned therein;
   exposing the gaseous biscyclopentadienyltitanium diazide precursor to light having an intensity of at least 100 mW/cm$^2$ within the reactor to dissociate titanium from the biscyclopentadienyltitanium diazide precursor; and
   providing a reactive gas into the reactor with the substrate positioned therein, the reactive gas combining with the titanium of the light exposed biscyclopentadienyltitanium diazide precursor to deposit a titanium compound layer on the substrate.

8. The chemical vapor deposition method of claim 7 wherein the light is provided at a wavelength from about 100 nm to about 800 nm.

9. The chemical vapor deposition method of claim 7 wherein pressure in the reactor during deposition of the titanium compound layer is from about 100 mTorr to about 20 Torr.

10. The chemical vapor deposition method of claim 7 wherein the reactive gas comprises hydrazine and wherein the deposited titanium compound layer comprises titanium nitride.

11. The chemical vapor deposition method of claim 7 wherein the reactive gas comprises 1,1 unsymmetrical dimethylhydrazine and wherein the deposited titanium compound layer comprises titanium nitride.

* * * * *

UNITED STATES PATENT AND TRADEMARK OFFICE
CERTIFICATE OF CORRECTION

PATENT NO. : 5,693,377

DATED : December 2, 1997

INVENTOR(S) : Donald L. Westmoreland, Brenda D. Wanner and David R. Atwell

It is certified that error appears in the above-identified patent and that said Letters Patent is hereby corrected as shown below:

Column 3, Line 5, change "Are" to --Arc--.

Column 5, Line 40, change "unsymmetrical; dimethyl-" to --unsymmetrical dimethyl- --.

Signed and Sealed this

Twenty-seventh Day of October, 1998

Attest:

BRUCE LEHMAN

Attesting Officer    Commissioner of Patents and Trademarks